(12) United States Patent
Kahen

(10) Patent No.: US 6,545,409 B2
(45) Date of Patent: Apr. 8, 2003

(54) ORGANIC LIGHT-EMITTING DIODE WITH HIGH CONTRAST RATIO

(75) Inventor: Keith B. Kahen, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 30 days.

(21) Appl. No.: 09/853,023

(22) Filed: May 10, 2001

(65) Prior Publication Data

US 2002/0190638 A1 Dec. 19, 2002

(51) Int. Cl.⁷ ................................................ H01J 1/62
(52) U.S. Cl. ...................................... 313/504; 313/506
(58) Field of Search .............................. 313/504, 503, 313/506, 112

(56) References Cited

U.S. PATENT DOCUMENTS

| | | | |
|---|---|---|---|
| 4,356,429 A | 10/1982 | Tang | 313/503 |
| 4,539,507 A | 9/1985 | VanSlyke et al. | 313/504 |
| 4,720,432 A | 1/1988 | VanSlyke et al. | 428/457 |
| 4,769,292 A | 9/1988 | Tang et al. | 428/457 |
| 4,885,211 A | 12/1989 | Tang et al. | 428/690 |
| 5,047,687 A | 9/1991 | VanSlyke | 313/503 |
| 5,049,780 A | 9/1991 | Dobrowolski et al. | |
| 5,059,862 A | 10/1991 | VanSlyke et al. | 313/503 |
| 5,061,569 A | 10/1991 | VanSlyke et al. | 428/457 |
| 6,307,528 B1 * | 10/2001 | Yap | 345/45 |

OTHER PUBLICATIONS

"Optical Interference, Contrast–Enhanced Electroluminescent Device", by J. A. Dobrowolski et al., Applied Optics, vol. 31, No. 28, Oct. 1, 1992.

\* cited by examiner

*Primary Examiner*—Gary Paumen
*Assistant Examiner*—Ann McCamey
(74) *Attorney, Agent, or Firm*—Raymond L. Owens

(57) ABSTRACT

An organic light-emitting diode includes a transparent substrate, a transparent anode layer disposed over the substrate, and a hole-transport layer disposed over the anode layer. The diode also includes a light-emitting layer disposed over the hole-transport layer, an electron-transport layer disposed over the light-emitting layer, a cathode disposed over the electron-transport layer and having a thickness selected so that light can pass through such cathode, and a light-absorbing layer disposed over the cathode. A dielectric spacer layer disposed over the light-absorbing layer and a conductive layer disposed over the spacer layer and electrically connected to the cathode so that when a voltage is applied between the transparent anode and the cathode, the light-emitting layer produces light which passes directly through the hole-transport layer and the transparent anode and substrate.

5 Claims, 3 Drawing Sheets

ORGANIC LIGHT-EMITTING DIODE WITH HIGH CONTRAST RATIO

FIELD OF THE INVENTION

The present invention relates to organic light-emitting diodes with an improved contrast ratio.

BACKGROUND OF THE INVENTION

An organic light-emitting diode (LED), also referred to as an organic electroluminescent (EL) device, is constructed in a normal configuration on a transparent substrate through which the light emitted by the device is viewed, and the device structure typically includes, in sequence, the transparent substrate, a transparent conductive hole-injecting electrode (also referred to as the anode), an organic hole-transporting layer, an organic light-emitting layer, an organic electron-transporting layer and an electron-injecting electrode (also referred to as the cathode) consisting of a metal having a low work function. Electron-hole recombination at or near a junction between the organic hole-transporting layer and the organic light-emitting layer results in light emission when the hole-injecting electrode is biased at a sufficient positive electrical potential with respect to the electron-injecting electrode. The highly reflective metal electrode helps to improve brightness of emission in that the electron-injecting electrode provides a surface from which internally generated light from the light-emitting layer is reflected and directed toward the transparent substrate. However, such a metallic electron-injecting electrode also reflects ambient light entering the device structure through the transparent substrate and the transparent hole-injecting electrode, thereby degrading the visually perceived contrast of the emitted light, as viewed by an observer. In numerous practical applications it is quite important that an organic light-emitting device can be easily viewed under ambient lighting conditions ranging from total darkness to full sunlight so that a sufficient reduction is required in reflection of ambient light from the mirror-like surface of the metal electron-injecting electrode. The legibility of displays under ambient lighting conditions can be quantified by defining a contrast ratio (CR):

$$CR=(L_{on}+R_L L_{amb})/(L_{off}+R_L L_{amb})$$

where $L_{on}$ and $L_{off}$ are the luminances of the on and off pixels, respectively, $L_{amb}$ is the ambient illuminance, and $R_L$ is the luminous reflectance of the display. As can be seen from this expression for the contrast ratio, as $R_L$ becomes very small, CR becomes very large. Thus, even if an approach for minimizing $R_L$ results in $L_{on}$ being somewhat smaller than its nominal (without any contrast reduction implementation) value, overall, CR will still be enhanced.

A well known approach for reducing glare attributed to ambient lighting is to use polarizers, particularly circular polarizers, which may be bonded to an outside surface of the transparent substrate. However, the use of polarizers adds significant cost and a polarizer bonded to a substrate is not a part of the integral layer structure of a light-emitting device.

In the construction of some inorganic light-emitting devices, one approach to enhance sunlight readability and reduction of glare has been to incorporate in such an inorganic device a light-absorbing layer and a dielectric spacer layer between the inorganic phosphor layer and the counter electrode layer. The thickness of the dielectric spacer layer is optimized to create destructive optical interference of the ambient light, thereby reducing ambient light reflection. This approach has produced inorganic light-emitting displays having 3.4% spectral reflectance [Dobrowolski et al., Appl. Optics 31, 5988 (1992)]. This approach is also discussed in U.S. Pat. No. 5,049,780 by Dobrowolski et al.

In the above inorganic structure it was stressed that in order to get very low photopic reflectance values, it was necessary to have the light-absorbing layer and the dielectric spacer layer interposed between the light-emitting layer and the reflective cathode. For this structure to be useful in organic EL devices, both the light-absorbing and dielectric-spacer layers need to be conductive, while the light-absorbing layer also must provide a work function less then 4.0 eV so as to enable adequate electron injection into the electron-transport layer. Additionally, the materials must be formable by deposition techniques which are compatible with organic EL device fabrication so as to minimize deleterious effects such as, for example, radiation damage or undesirable chemical or physical interactions between the reflection-reducing layers and the organic layers.

Thus, the requirements and specifications imposed on ambient light reflection-reducing layers useful in organic light-emitting devices are substantially different from and more stringent than the requirements for such reflection-reducing layers for an inorganic light-emitting device.

SUMMARY OF THE INVENTION

It is an object of the present invention to provide an organic light-emitting device having higher contrast ratios by reducing the ambient light reflection from the cathode.

This object is achieved by an organic light-emitting diode, comprising:

a) a transparent substrate;

b) a transparent anode layer disposed over the substrate;

c) a hole-transport layer disposed over the anode layer;

d) a light-emitting layer disposed over the hole-transport layer;

e) an electron-transport layer disposed over the light-emitting layer;

f) a thin cathode layer disposed over the electron-transport layer and having a thickness selected so that light can pass through such cathode;

g) a light-absorbing layer disposed over the cathode layer;

h) a dielectric spacer layer disposed over the light-absorbing layer; and i) a conductive layer disposed over the spacer layer and electrically connected to the cathode so that when a voltage is applied between the transparent anode and the cathode, the light-emitting layer produces light which passes directly through the hole-transport layer and the transparent anode and substrate.

ADVANTAGES

It is an advantage of the present invention to make use of an organic light-emitting structure for producing light that has large contrast ratios. It has been found that by having the transparent cathode directly over the electron-transport layer and providing a light-absorbing layer and a dielectric spacer layer before applying a conductive layer, that a highly efficient light-emitting diode structure can be produced. This structure has high contrast ratios so that it can be effectively used under varied ambient lighting conditions.

BRIEF DESCRIPTION OF THE DRAWINGS

FIGS. 1 and 2 are necessarily of a schematic nature, since thicknesses of the individual layers are too thin, and thickness differences of the various elements too great to permit depiction to scale or to permit convenient proportionate scaling.

DETAILED DESCRIPTION OF THE EMBODIMENTS

In order to more fully appreciate the construction and performance of the organic light-emitting devices having reduced ambient light reflection from a cathode, a prior art organic light-emitting device 100 of FIG. 1 will be described.

Figure 1:
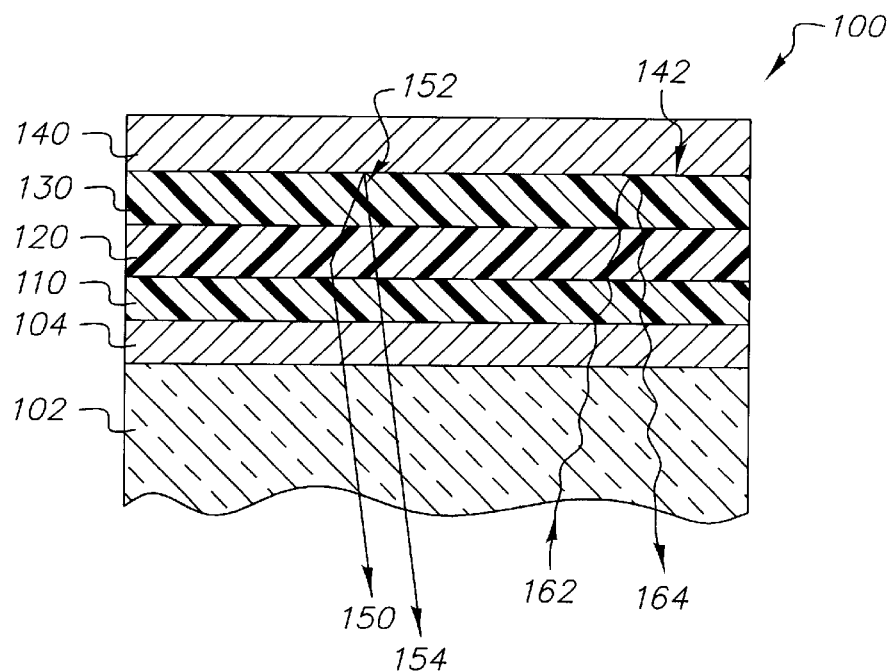
FIG. 1 is a schematic cross section of a prior art organic light-emitting device having a reflective cathode surface from which ambient light as well as internally-generated light is reflected.

In the prior art shown in FIG. 1, an organic light-emitting device 100 has a transparent substrate 102 on which is formed a transparent hole-injecting anode 104. The substrate 102 can be glass or quartz, and the anode 104 is preferably a thin layer of indium tin oxide (ITO) formed over the substrate 102. An organic hole-transport layer 110 is formed over the anode 104, an organic light-emitting layer 120 is formed over the hole-transport layer 110, and an organic electron-transport layer 130 is formed over the light-emitting layer 120. Lastly, a cathode 140 is formed over the electron-transport layer 130, and of a material selected to have a work function less than 4.0 eV. The color or hue of light emitted from the device 100 can be selected by incorporating a fluorescent organic material, also referred to as a dopant, into the organic light-emitting layer 120.

Under typical bias conditions, electrons (negative-charge carriers) will be injected from the cathode 140 into the organic electron-transport layer 130, and holes (positive charge carriers) will be injected from the anode 104 into the organic hole-transport layer 110. Electrons and holes are transported through the corresponding organic layers 130 and 110 and into the organic light-emitting layer 120. In the organic light-emitting layer 120 the electrons and holes mainly recombine near the junction between the hole-transport layer 110 and the light-emitting layer 120. The resulting recombination results in light emission from the organic light-emitting layer 120. Of the light generated in the emitting layer, approximately 50% is directly emitted in the direction of the substrate 102, as light 150, while the other 50% is emitted toward the cathode 140 as light 152, and is reflected from the cathode surface 142 as light 154. A combination of the reflected light 154 and the directly-emitted light 150 result in the total light seen by an observer through the substrate 102.

If the device 100 is viewed under ambient light conditions ranging from room lighting to bright sunlight, such ambient light 162 can readily enter the device through the transparent substrate 102 and the transparent anode 104, as indicated by a wavy line with arrows. This ambient light 162 entering the device 100 is reflected from the surface 142 of the cathode, shown as reflected ambient light 164 by a wavy line. It will be appreciated that the ambient light 162 entering the device 100 and reflected at the cathode surface 142 to form the reflected ambient light 164 will degrade the visually perceived contrast of the internally emitted lights 150 and 154, as viewed by an observer.

The materials useful in the construction of this prior art organic light-emitting device 100 can be selected from among materials, configurations of layers, and preferred layer thicknesses of conventional organic light-emitting devices such as those described by Tang U.S. Pat. No. 4,356,429; VanSlyke et al. U.S. Pat. No. 4,539,507; VanSlyke et al. U.S. Pat. No. 4,720,432; Tang et al. U.S. Pat. No. 4,885,211; Tang et al. U.S. Pat. No. 4,769,292; VanSlyke et al. U.S. Pat. No. 5,047,687; VanSlyke et al. U.S. Pat. No. 5,059,862; and VanSlyke et al. U.S. Pat. No. 5,061,569, the disclosures of which are herein incorporated by reference.

Figure 2:
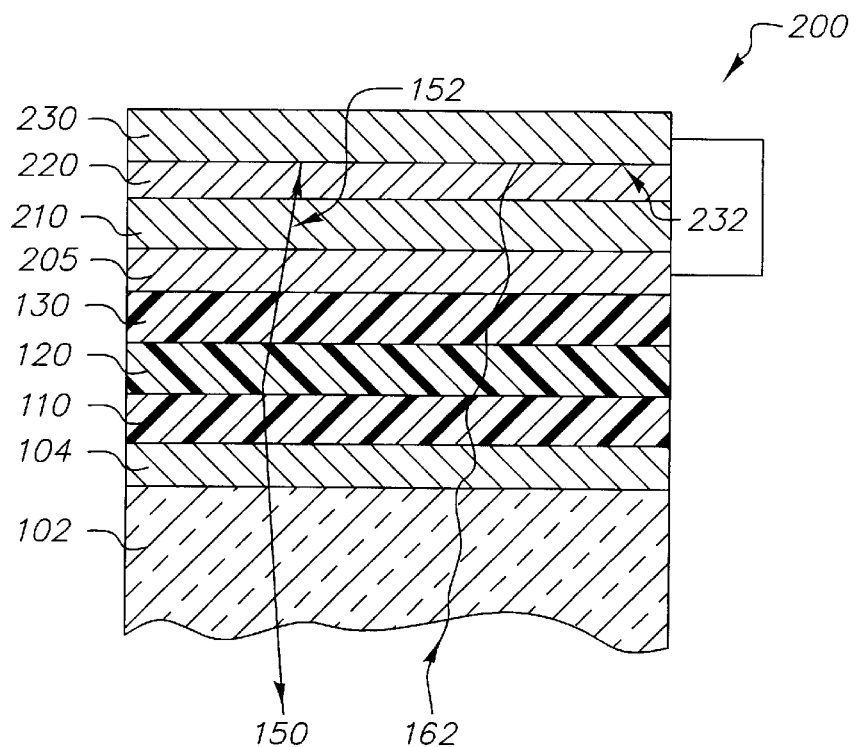
FIG. 2 is a schematic cross section view of an organic LED device made in accordance with the present invention, and having a thin cathode, a light-absorbing layer, and a dielectric spacer layer disposed between an organic electron-transporting layer and a conductive layer.

Turning to FIG. 2, a schematic cross section of an organic light-emitting device 200 differs from the construction of the prior art device 100 of FIG. 1 in that a light-absorbing layer 210 and a dielectric spacer layer 220 are added to the structure following the electron-transport layer 130. If electrons were to flow in these two additional layers, then they would both need to be conductive, while the light-absorbing layer 210 would also need to provide a work function less than 4.0. These requirements greatly limit the choices for these two layers. To avoid this problem, the light-absorbing layer 210 and the dielectric spacer layer 220 are deposited after a thin cathode 205 so that electrons are injected directly into the electron-transport layer 130. As a result in the device 200, current flows between the transparent anode 104 and the thin cathode 205. Since current does not flow in the light-absorbing layer 210 and the dielectric spacer layer 220, many more materials can be chosen as suitable candidates for these layers.

As shown schematically in FIG. 2, a conductive layer 230 is disposed over the spacer layer and electrically connected to the cathode 205 so that when a voltage is applied between the transparent anode and the cathode, the light-emitting layer produces light which passes directly through the hole-transport layer and the transparent anode. In prior art devices, the conductive layer 230 would normally operate as the electron-injecting cathode. Since the thin cathode layer 205 injects electrons into the device 200, the conductive layer 230 is only required to lower the sheet resistance between the external bus metal and the device 200. The combination of layers 210 and 220 substantially eliminates reflection of ambient light 162 entering the device through the transparent substrate 102 and the transparent anode 104, as well as reflection of the light 152 from the organic light-emitting layer 120 emitted in a direction toward the thin cathode layer 205. Light 150 is emitted from the device through the substrate 102.

A preferred thin cathode layer 205 is MgAg, where the MgAg volume ratio is 10:1. It can be formed by conventional thermal vapor deposition over the electron-transport layer 130 at a layer thickness in a preferred range from 3 to 20 nm. The layer thickness of the thin cathode layer 205 is chosen to be sufficiently thin so as to be substantially transparent, while of such thickness to avoid added conductance voltage drops. Particularly useful materials for forming the light-absorbing layer 210 are ones which have an absorption coefficient larger than $1 \times 10^4$ cm$^{-1}$. Such preferred materials can include copper phthalocyanine (CUPC)

and Bisbenzimidazo(2,1-a:2',1'-a')anthra(2,1,9-def:6,5,10-d'e'f') diisoquinoline-10,21-dione (PV). The light-absorbing layer 210 can be formed by conventional thermal vapor deposition over the thin cathode layer 205 at a layer thickness in a preferred range from 10 to 200 nm. The dielectric spacer layer 220 operates in a fashion as described by Dobrowolski et al., U.S. Pat. No. 5,049,780, where it was shown to lead to added contrast enhancement as a result of enabling interference-enhanced absorption. A particularly useful material for forming the dielectric spacer layer 220 is aluminum tris(8-hydroxyquinoline) (Alq) which can be formed by conventional thermal vapor deposition over the light-absorbing layer 210 at a layer thickness in a preferred range from 0 to 150 nm. The conductive layer 230 can either have a high or low work function since it does not inject electrons into device 200. One particular embodiment is to form the layer using ITO, since it is transparent and will lead to negligible light reflections at the interface 232 between the dielectric spacer layer 220 and the conductive layer 230. The ITO can be grown by conventional sputter deposition over the dielectric spacer layer 220 at a layer thickness in a preferred range from 50 to 300 nm. Another embodiment is to form the conductive layer 230 from a metal, such as MgAg, whose deposition procedure was described above. In that case there can be substantial light reflection at interface 232, which gets absorbed by the light-absorbing layer 210. A preferred thickness of the metallic conductive layer in this later embodiment is 20 to 100 nm.

EXAMPLES

The following two examples are presented for a further understanding of the embodiments of the invention. Each example device contains the following base configuration which was constructed as follows:

a) a transparent anode of ITO-coated glass (ITO thickness of 85 nm) was ultrasonicated in a commercial detergent, rinsed in deionized water, degreased in toluene vapor, and contacted by a strong oxidizing agent;

b) a 190 nm thick 4,4'-bis-[N-(1-naphthyl)-N-phenylamino]-biphenyl (NPB) hole-transport layer was deposited over the ITO anode by conventional thermal vapor deposition; and c) a 30 nm thick Alq light-emitting layer doped with 0.5% of Coumarin 545T (C545T) was deposited over the NPB layer by conventional thermal vapor deposition.

The above structure serves as a base configuration for each of the following examples.

Example A

A prior art organic light-emitting device was constructed as follows:

An Alq electron-transport layer was deposited over the light-emitting layer of the base configuration by conventional thermal vapor deposition to a thickness of 40 nm. A MgAg cathode was deposited over the Alq layer by conventional thermal vapor co-deposition from two sources (Mg and Ag) to a thickness of 100 nm.

Example B

An embodiment of an enhanced-contrast organic light-emitting diode device was constructed as follows:

An Alq electron-transport layer was deposited over the light-emitting layer of the base configuration by conventional thermal vapor deposition to a thickness of 20 nm. A MgAg thin cathode layer was deposited over the Alq layer by conventional thermal vapor co-deposition from two sources (Mg and Ag) to a thickness of 5 nm.

A PV light-absorbing layer was deposited over the cathode by conventional thermal vapor deposition to a thickness of 50 nm. An Alq dielectric spacer layer was deposited over the absorbing layer by conventional thermal vapor deposition to a thickness of 50 nm.

A MgAg conductive layer was deposited over the spacer layer by conventional thermal vapor co-deposition from two sources (Mg and Ag) to a thickness of 100 nm.

Results

Figure 3:
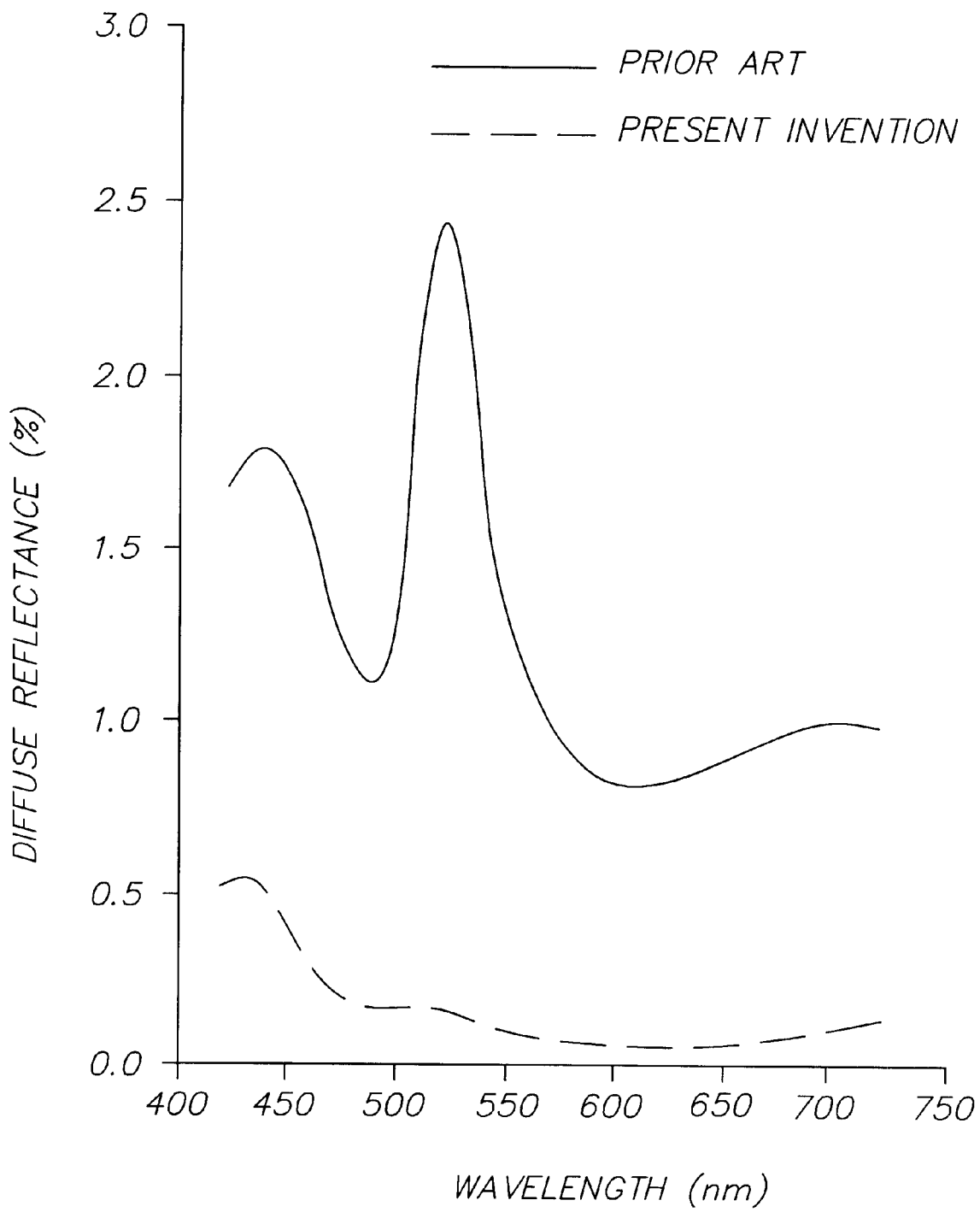
FIG. 3 compares in graphic form the diffuse spectral reflectances of a prior art organic EL device of FIG. 1 and an organic EL device containing the thin cathode and the reflection-reducing layers of FIG. 2.

As will become apparent from viewing FIG. 3, the reflection reducing structure of the light-absorbing layer 210 and dielectric spacer layer 220 of device 200 is effective in reducing ambient light reflection from the device, thereby enhancing the contrast in observing the emitted light 150 under ambient light conditions. FIG. 3 shows in graphic form a measured relationship between diffuse reflectance (reflection beam intensity) and wavelength of an incident light beam used in a reflectance spectrophotometer. The reflectance trace of the inventive device of FIG. 2 (Example B) having a PV light-absorbing layer and an Alq dielectric spacer layer is plotted along with the diffuse reflectance trace of the prior art device of FIG. 1 (Example A). Cascading the results of FIG. 3 with the human eye's photopic response results in the prior art device having a photopic diffuse reflectance of 1.3%, while the device of FIG. 2 has a photopic reflectance of 0.12%. As a result the photopic diffuse reflectance of the inventive device is about a factor of 11 less than the photopic diffuse reflectance of the prior art device.

Figure 4:
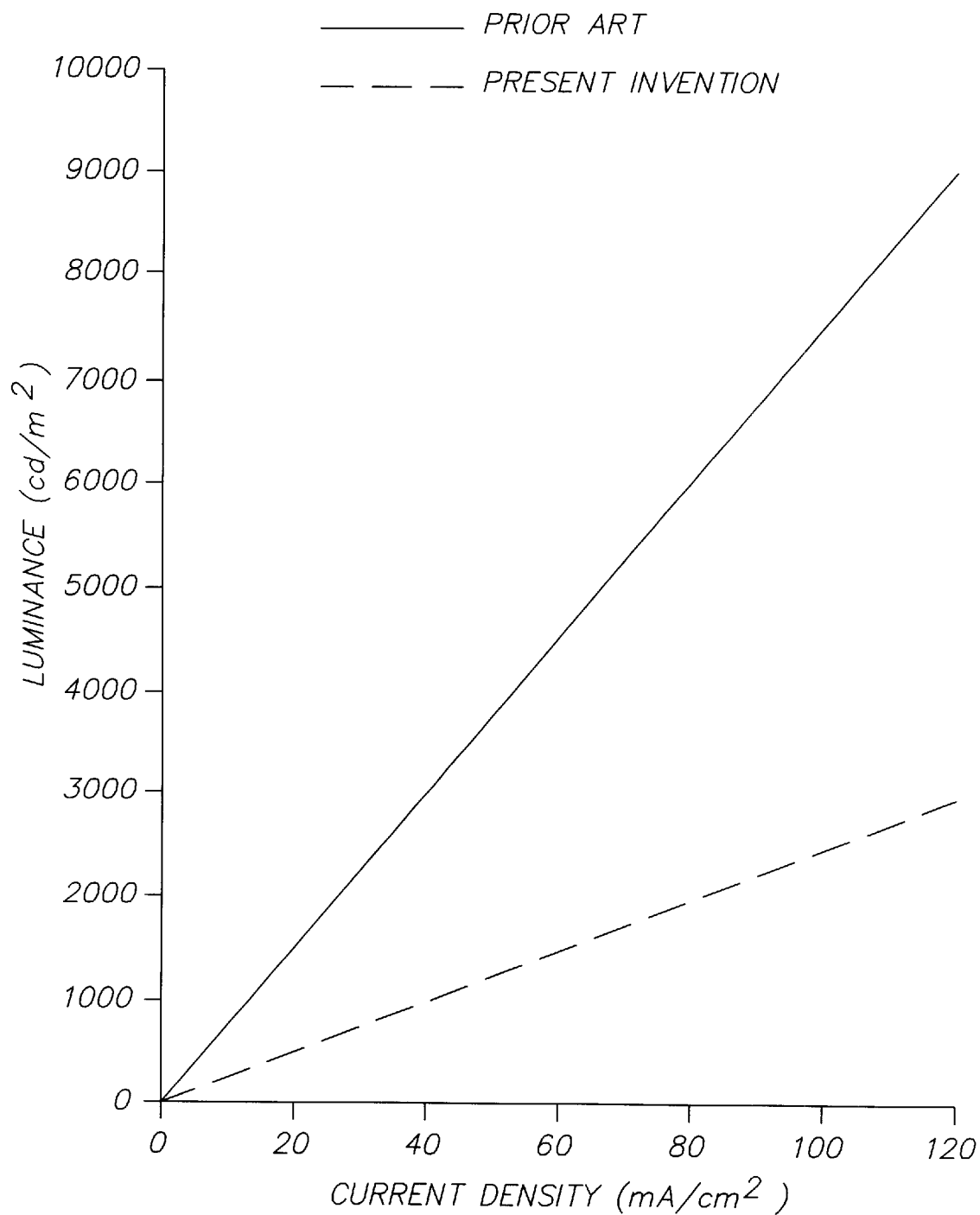
FIG. 4 shows in graphic form a luminance-current density relationship of a prior art optimized organic EL device, and of an organic EL device having the thin cathode and the reflection reducing layers of the device of FIG. 2.

FIG. 4 shows in graphic form a relationship between luminance (of emitted light) and current density for a prior art device (Example A) and for the enhanced-contrast device having the PV light-absorbing layer (Example B). The luminance of the enhanced-contrast device reaches approximately 33% of the luminance of the prior art device at a current density of 40 mA/cm$^2$. Such luminance reduction is attributed to the effectiveness of the PV light-absorbing layer and the Alq dielectric spacer layer in absorbing light 152 (see FIG. 2) which is emitted by the light-emitting layer 120 in the direction of the thin cathode 205. By contrast, in the prior art device 100, most of the light emitted by the light-emitting layer 120 in the direction of the cathode 140 is reflected back to the observer as light 154.

Viewing FIGS. 3–4 together, it will be appreciated that the inventive devices provide a substantially enhanced contrast for viewing light emitted from these embodiments of enhanced-contrast organic light-emitting devices under ambient light conditions ranging from ambient fluorescent lighting to higher intensity ambient lighting.

The invention has been described in detail with particular reference to certain preferred embodiments thereof, but it will be understood that variations and modifications can be effected within the spirit and scope of the invention.

PARTS LIST 100 organic light-emitting device
102 transparent substrate
104 a transparent hole-injecting anode
110 organic hole-transport layer
120 organic light-emitting layer
130 organic electron-transport layer
140 cathode layer
142 cathode surface
150 light emitted in the direction of the substrate 152 light emitted in the direction of the cathode
154 light reflected by the cathode
162 ambient light incident on device
164 ambient light reflected by the cathode
200 organic light-emitting device
205 thin cathode layer
210 light-absorbing layer
220 dielectric spacer layer
230 conductive layer
232 conductive layer surface

What is claimed is:

1. An organic light-emitting diode, comprising:

a) a transparent substrate;

b) a transparent anode layer disposed over the substrate;

c) a hole-transport layer disposed over the anode layer;

d) a light-emitting layer disposed over the hole-transport layer;

e) an electron-transport layer disposed over the light-emitting layer;

f) a thin cathode layer disposed over the electron-transport layer and having a thickness selected so that light can pass through such cathode;

g) a light-absorbing layer disposed over the cathode layer;

h) a dielectric spacer layer disposed over the light-absorbing layer; and i) a conductive layer disposed over the spacer layer and electrically connected to the cathode so that when a voltage is applied between the transparent anode and the cathode, the light-emitting layer produces light which passes directly through the hole-transport layer and the transparent anode and substrate.

2. The device of claim 1 wherein the cathode is a metal having a work function less than 4.0 but greater than 0 and capable of providing electron injection into the electron-transport layer.

3. The device of claim 1 wherein the light-absorbing layer is a material having an absorption coefficient greater than $10^4$ cm$^{-1}$.

4. The device of claim 1 wherein the dielectric spacer layer has a thickness between 0 and 150 nm.

5. The device of claim 1 wherein the conductive layer is transparent or reflective.

* * * * *